United States Patent
Ghilardelli et al.

(10) Patent No.: US 6,184,741 B1
(45) Date of Patent: *Feb. 6, 2001

(54) BIDIRECTIONAL CHARGE PUMP GENERATING EITHER A POSITIVE OR NEGATIVE VOLTAGE

(75) Inventors: Andrea Ghilardelli, Cinisello Balsamo; Giovanni Campardo, Bergamo; Jacopo Mulatti, Latisana, all of (IT)

(73) Assignee: SGS-Thomson Microelectronics S.r.l., Agrate Brianza (IT)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/900,165

(22) Filed: Jul. 28, 1997

(30) Foreign Application Priority Data

Aug. 2, 1996 (EP) .................................................. 96830441

(51) Int. Cl.[7] ........................................................ G05F 1/10
(52) U.S. Cl. ............................... 327/536; 363/60; 363/63
(58) Field of Search .................................. 327/536, 534, 327/535, 537, 538; 363/59, 60, 61, 63

(56) References Cited

U.S. PATENT DOCUMENTS

| | | | |
|---|---|---|---|
| 4,837,466 | 6/1989 | Kanauchi | 307/605 |
| 4,935,644 | * 6/1990 | Tsujimoto | 327/537 |
| 4,999,761 | * 3/1991 | Bingham et al. | 363/63 |
| 5,043,858 | 8/1991 | Watanabe | 363/61 |
| 5,436,587 | 7/1995 | Cernea | 327/536 |
| 5,606,491 | * 2/1997 | Ellis | 363/60 |
| 5,610,549 | * 3/1997 | Choi | 327/536 |
| 5,812,018 | * 9/1998 | Sudo et al. | 327/589 |

* cited by examiner

Primary Examiner—Jung Ho Kim
(74) Attorney, Agent, or Firm—Wolf, Greenfield & Sacks, P.C.; James H. Morris; Theodore E. Galanthay (57) ABSTRACT

A charge pump comprises at least one charge pump stage including a first diode having an anode and a cathode, and a capacitor having a first plate connected to the cathode of the diode and a second plate connected to a clock signal that periodically varies between a reference voltage and a supply voltage, the anode of said diode forming a first terminal of the charge pump. The charge pump further comprises a second diode having an anode connected to the cathode of the first diode and a cathode forming a second terminal of the charge pump, first switching means for selectively coupling the first terminal of the charge pump to the voltage supply and second switching means for selectively coupling the second terminal of the charge pump to the reference voltage. The first switching means and the second switching means are respectively closed and open in a first operating condition whereby the second terminal of the charge pump acquires a voltage of the same polarity but higher in absolute value than said supply voltage. The first switching means and the second switching means are respectively open and closed in a second operating condition whereby the first terminal of the charge pump acquires a voltage of opposite polarity with respect to said voltage supply.

45 Claims, 4 Drawing Sheets

BIDIRECTIONAL CHARGE PUMP GENERATING EITHER A POSITIVE OR NEGATIVE VOLTAGE

BACKGROUND OF THE INVENTION

1. Field of the Invention

The present invention relates to a bidirectional charge pump, and more particularly to a bidirectional charge pump used in CMOS memory devices such as EPROMs, EEPROMs and Flash EPROMs.

2. Discussion of the Related Art

In several integrated circuits it is necessary to generate, internally to the chip, voltages which are higher than or opposite in sign of the supply voltage of the chip. This can be done by means of charge pumps. For example, in a single-power-supply Flash EPROM, it is necessary to generate a positive voltage higher than the supply voltage (VDD) for programming memory cells of the EPROM, and a negative voltage for erasing the memory cells.

Up to now, distinct charge pumps have been used to generate different voltages: positive charge pumps for generating voltages higher than the supply voltage, and negative charge pumps for generating negative voltages.

On the other hand, it is known that the main problem of the integration of a charge pump is the large chip area occupied by the capacitors of the charge pump. The necessity of providing more than one charge pump exacerbates this problem.

SUMMARY OF THE INVENTION

In view of the state of the art described, it is an object of the present invention to provide a bidirectional charge pump, i.e. a charge pump that can be used to generate both positive voltages higher than the supply voltage, and negative voltages.

In one embodiment of the present invention a charge pump is provided. The charge pump includes at least one charge pump stage including a first diode, and a capacitor, an anode of the diode forming a first terminal of the charge pump, a second diode having an anode connected to the cathode of the first diode and a cathode forming a second terminal of the charge pump, first switching means for selectively coupling the first terminal of the charge pump to a supply voltage, and a second switching means for selectively coupling the second terminal of the charge pump to a reference voltage, the first switching means and the second switching means being respectively closed and opened in a first operating condition whereby the second terminal of the charge pump acquires a voltage of the same polarity but higher in absolute value than the supply voltage, the first switching means and the second switching means being respectively opened and closed in a second operating condition whereby the first terminal of the charge pump acquires a voltage of opposite polarity with respect to the supply voltage.

In another embodiment, a charge pump is provided for coupling to first and second terminals of a voltage supply to receive a supply voltage having a magnitude and a polarity with respect to a reference voltage and for generating a boosted voltage having a magnitude and a polarity. The charge pump includes a first input coupled to the first terminal of the voltage supply to receive the supply voltage, a second input coupled to the second terminal of the voltage supply to receive the reference voltage, a charge pump circuit having a first voltage node and a second voltage node, the charge pump circuit being configured to transfer electrical charge from the first node to the second node. The charge pump further comprises a first switch that selectively couples the first node of the charge pump circuit to the first input, and a second switch that selectively couples the second node of the charge pump circuit to the second input.

In another embodiment, a charge pump is provided for coupling to a voltage supply to receive a supply voltage having a magnitude and a polarity with respect to a reference voltage for generating a boosted voltage having a magnitude and a polarity. The charge pump includes a charge pump circuit having a first voltage node and a second voltage node, the charge pump circuit being configured to transfer electrical charge from the first node to the second node, means for coupling the charge pump circuit to the first input for a first mode of operation of the charge pump for producing a voltage at the first node having a polarity opposite the polarity of the supply voltage and having a magnitude greater than the magnitude of the supply voltage, and means for coupling the charge pump circuit to the voltage supply for a second mode of operation of the charge pump circuit for producing a voltage at the second node having a polarity equal to the polarity of the supply voltage and having a magnitude greater than the magnitude of the supply voltage.

In another embodiment of the present invention, a method is provided for generating a boosted voltage having a magnitude and a polarity with respect to a reference voltage using a supply voltage having a magnitude and a polarity with respect to the reference voltage. The method includes steps of providing a charge pump circuit having a first voltage node and a second voltage node, the charge pump circuit being configured to transfer electrical charge from the first node to he second node, applying the supply voltage to the first node of the charge pump circuit to produce a boosted voltage at the second node, the boosted voltage having a polarity equal to the polarity of the supply voltage and having a magnitude greater than the magnitude of the supply voltage, and applying the reference voltage to the second node of the charge pump circuit to produce a boosted voltage at the first node, the boosted voltage having a polarity opposite the polarity of the supply voltage and having a magnitude greater than the magnitude of the supply voltage.

In another embodiment of the present invention a memory device is provided. The memory device includes a first input to receive a supply voltage having a magnitude and a polarity with respect to a reference voltage, a second input to receive the reference voltage, a charge pump coupled to the first and second inputs to respectively receive the supply voltage and the reference voltage, the charge pump including a charge pump circuit having a first voltage node and a second voltage node, the charge pump circuit being configured to transfer electrical charge from the first node to the second node, a first switch that selectively couples the first node of the charge pump circuit to the first input of the memory device, and a second switch that selectively couples the second node of the charge pump circuit to the second input of the memory device, and a first clock input to receive a first clock signal. The memory device further includes a clock generator coupled to the first clock input of the charge pump circuit to provide the first clock signal.

Thanks to embodiments of the present invention, it is possible to use a single charge pump for generating both positive voltages higher than the voltage supply, and negative voltages. This allows for a great reduction in the chip area of memory devices using charge pumps.

BRIEF DESCRIPTION OF THE DRAWINGS

These and other features of the present invention will be made more evident by the following detailed description of a particular embodiment, illustrated as a non-limiting example in the annexed drawings, wherein.

DETAILED DESCRIPTION

Figure 1:
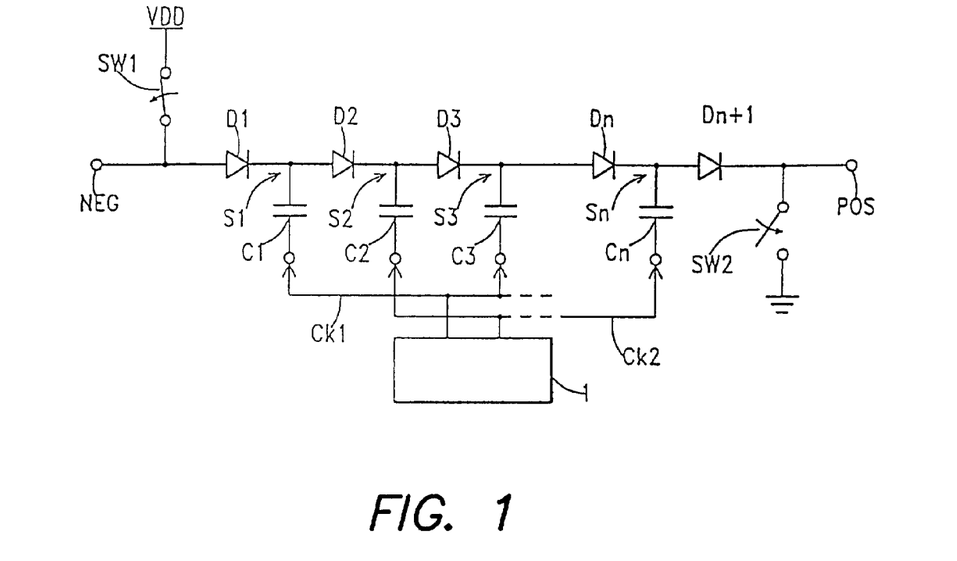
FIG. 1 is a schematic circuit diagram of a charge pump according to one embodiment of the present invention.

With reference to FIG. 1, there is shown a charge pump according to the present invention. The charge pump comprises a plurality of serially-connected charge pump stages S1, S2, S3, ... Sn; each stage comprises a diode D1–Dn and a capacitor C1–Cn. The diode D1 of the first stage has an anode connected to a first output terminal NEG of the charge pump; terminal NEG can also be selectively coupled, by means of a switch SW1, to a voltage supply VDD (conventionally, supposing that the charge pump is integrated in a CMOS memory device, VDD is a 5V or a 3V voltage supply). The diode Dn of the last stage Sn has a cathode connected to an anode of a diode Dn+1, which in turn has a cathode connected to a second output terminal POS of the charge pump; terminal POS can also be selectively coupled, by means of a switch SW2, to a reference voltage supply (ground voltage). Capacitors C1, C3, ... are driven by a first clock signal CK1; capacitors C2, ..., Cn are driven by a second clock signal CK2. Clock signals CK1 and CK2 are generated by a clock generator 1.

Figure 2A:
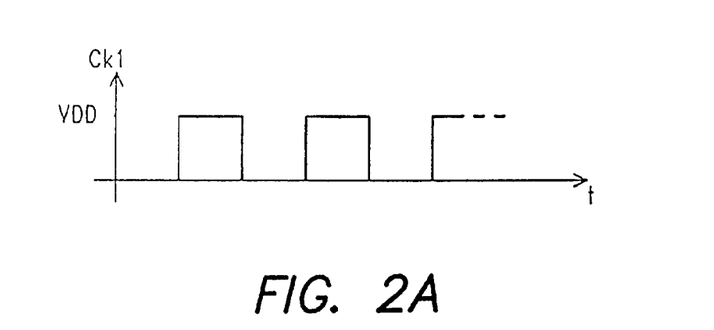
FIGS. 2A and 2B are timing diagrams of clock signals driving the charge pump of FIG. 1.
Figure 2B:
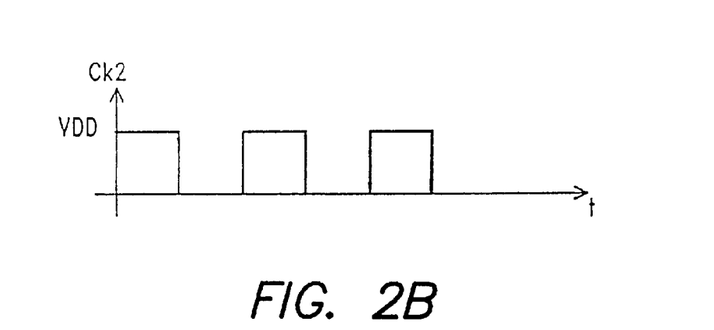

FIGS. 2A and 2B show the timing of clock signals CK1 and CK2, respectively; signals CK1 and CK2 are square-wave digital signals switching between ground and the voltage supply VDD; signals CK1 and CK2 are substantially in phase opposition to each other.

When switch SW1 is closed and switch SW2 is open, a positive charge is transferred from each capacitor of the charge pump to the righthand adjacent one. Thus, positive charge is transferred from the voltage supply VDD to terminal POS. Consequently, output terminal POS takes (after a transient) a positive voltage higher than VDD; the exact value of the voltage at POS depends on the number of stages of the charge pump: ideally, such a voltage is equal to n times the value of VDD, where n is the number of stages of the charge pump; in the practice, the voltage at terminal POS is always lower than said ideal value, for example because the turn-on voltage of the diodes D1–Dn+1 is to be taken into account.

When switch SW1 is open and switch SW2 is closed, a positive charge is again transferred from each capacitor of the charge pump to the righthand adjacent one. Thus, a positive charge is transferred from the output terminal NEG to ground, and terminal NEG takes a negative voltage, whose value again depends on the number of stages of the charge pump.

Thus, the charge pump of FIG. 1 can work both as a positive charge pump and as a negative charge pump.

Figure 3:
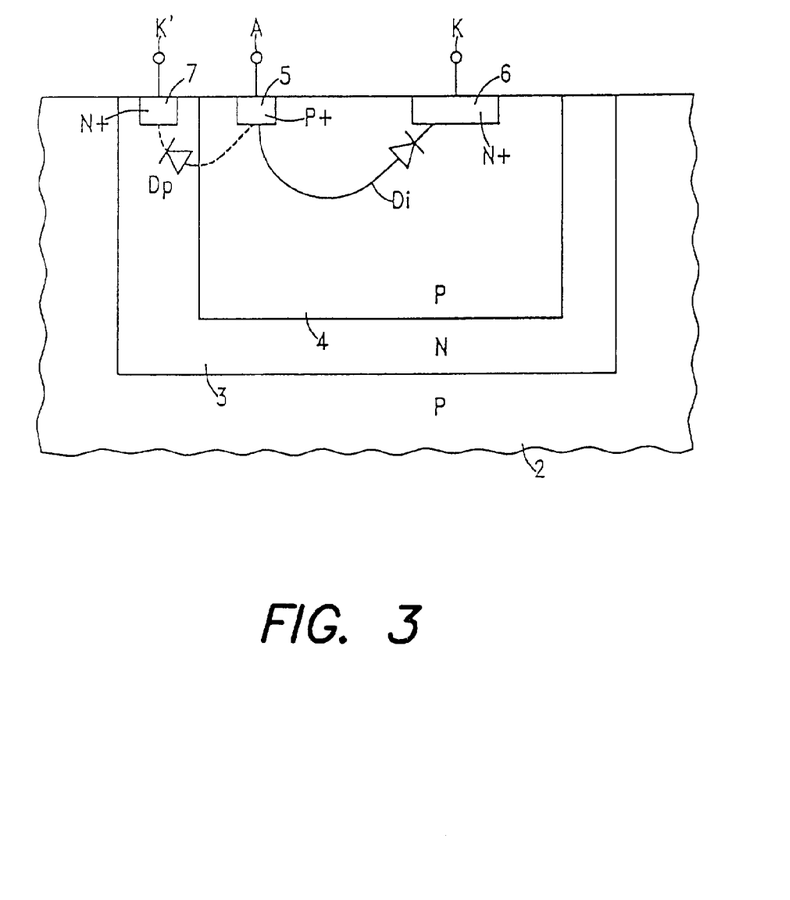
FIG. 3 is a cross-sectional view of a diode of the charge pump of FIG. 1.

FIG. 3 shows in cross-section the preferred structure of a diode D1–Dn+1 of the charge pump; such a structure is particularly useful for integration in CMOS memory devices such as, for example, EPROMs, EEPROMs and Flash EEPROMs. A P type silicon substrate 2 represents the substrate wherein the CMOS memory device is formed. Inside substrate 2, an N type well 3 is formed, and inside N type well 3 a P type well 4 is formed. Inside P type well 4, a P+ contact region 5 is formed for biasing the P type well, and an N+ region 6 is also formed. N+ region 6 forms a cathode K of the diode Di, while the P type well 4 and the P+ contact region 5 form an anode A of the diode Di. Inside N type well 3 an N+ contact region 7 is formed for biasing the N type well 3; it is possible to see that the structure has inherently associated a parasitic diode Dp having anode coincident with that of diode Di, and cathode K' formed by the N type well 3 and the N+ contact region 7. Diode Dp must be kept in reverse-biasing condition in order to achieve correct working of the structure. In the following, it will be described how it is possible to guarantee the correct biasing of the parasitic diode Dp in each stage of the charge pump, both in positive-voltage and in negative-voltage generation modes of the charge pump.

Figure 4:
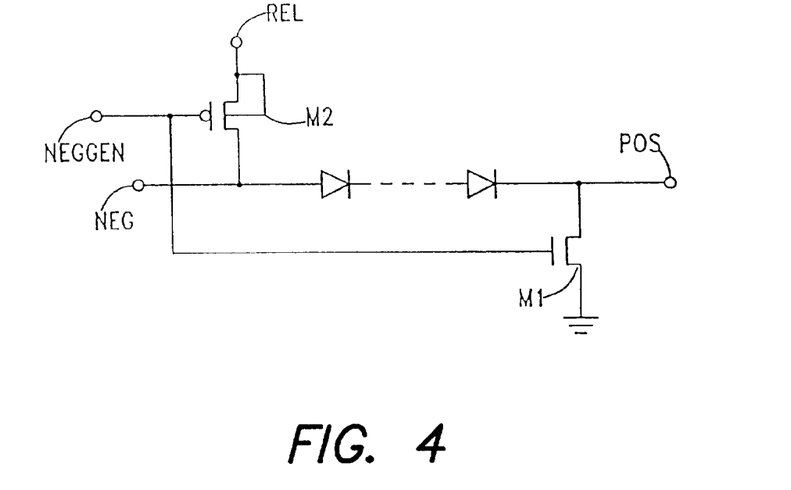
FIG. 4 s a circuit diagram showing a practical embodiment of the charge pump of FIG. 1.

FIG. 4 shows a practical embodiment of switches SW1 and SW2. Switch SW2 is formed by means of an N-channel MOSFET M1 with drain connected to terminal POS, source connected to ground and gate driven by a control signal NEGGEN which is a logic "0" when the charge pump works as a positive charge pump, while NEGGEN is a logic "1" when the charge pump works as a negative charge pump. Switch SW1 is instead formed by means of a P-channel MOSFET M2 with drain connected to terminal NEG, gate connected to signal NEGGEN and source connected to a signal REL which when the charge pump works as a positive charge pump is connected to the voltage supply VDD, while when the charge pump works as a negative charge pump it is switched to ground to reduce the electrical stress of the n-well drain junction of MOSFET M2.

Figure 5A:
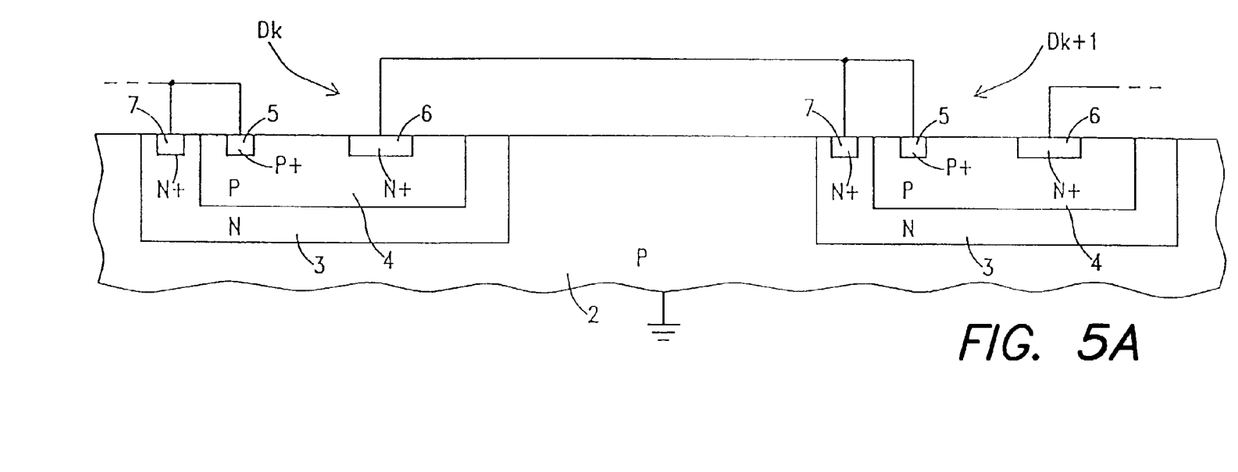
FIGS. 5A and 5B show in cross-sectional view a biasing scheme of the diodes of the charge pump, respectively when the charge pump is used to generate positive voltages and negative voltages.

FIG. 5A shows the biasing scheme of the N type well 3 of the diodes D1–Dn+1 of the charge pump of FIG. 1 when the latter works as a positive charge pump. In this figure, two adjacent diodes Dk, Dk+1 of the charge pump are shown in cross-section. The P type substrate 2 is conventionally kept grounded. In each diode, the N+ contact region 7 is electrically connected to the P+ contact region 5 (which is in turn connected to the N+ region 6 of the preceding diode); in this way, the N type well 3 of each diode is biased at the same potential of the anode A of the diode. Thanks to this arrangement, the junction between the N type well 3 and the P type well 4 can never be forward biased, and it is assured that the parasitic diode Dp associated to each diode of the charge pump is interdicted.

Figure 5B:
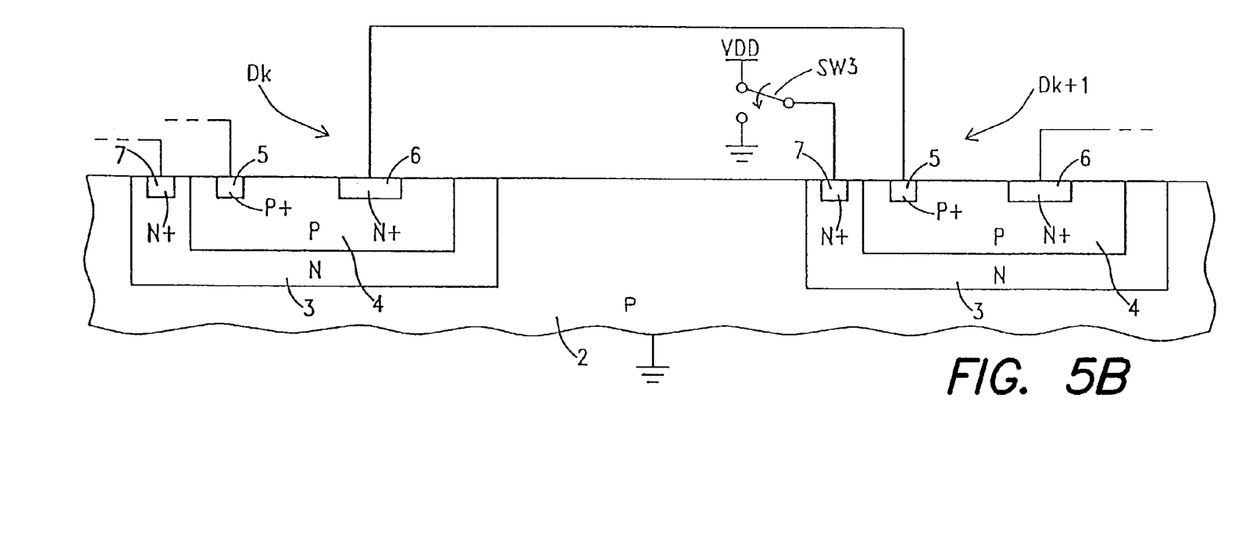

Similarly to FIG. 5A, FIG. 5B shows the biasing scheme of the N type well of diodes D1–Dn+1 when the charge pump works as a negative charge pump. Again, the P type substrate 2 is kept grounded. In this case however, the N type well 3 of each diode is biased at the voltage supply VDD or at ground. More precisely, the N type well of all the diodes D1–Dn+1 of the charge pump are initially biased at VDD; then, when the voltage at terminal NEG takes a negative value with a rather high absolute value, the N type well of the diodes belonging to the charge pump stages near terminal NEG is switched to ground (switch SW3 in FIG. 5B), so to reduce the voltage difference between the N type well 3 and the P type well 4 of said diodes. In this way, reliability of the structure is increased. The N type well of the diodes belonging to charge pump stages sufficiently far away from terminal NEG is kept at VDD.

Figure 6:
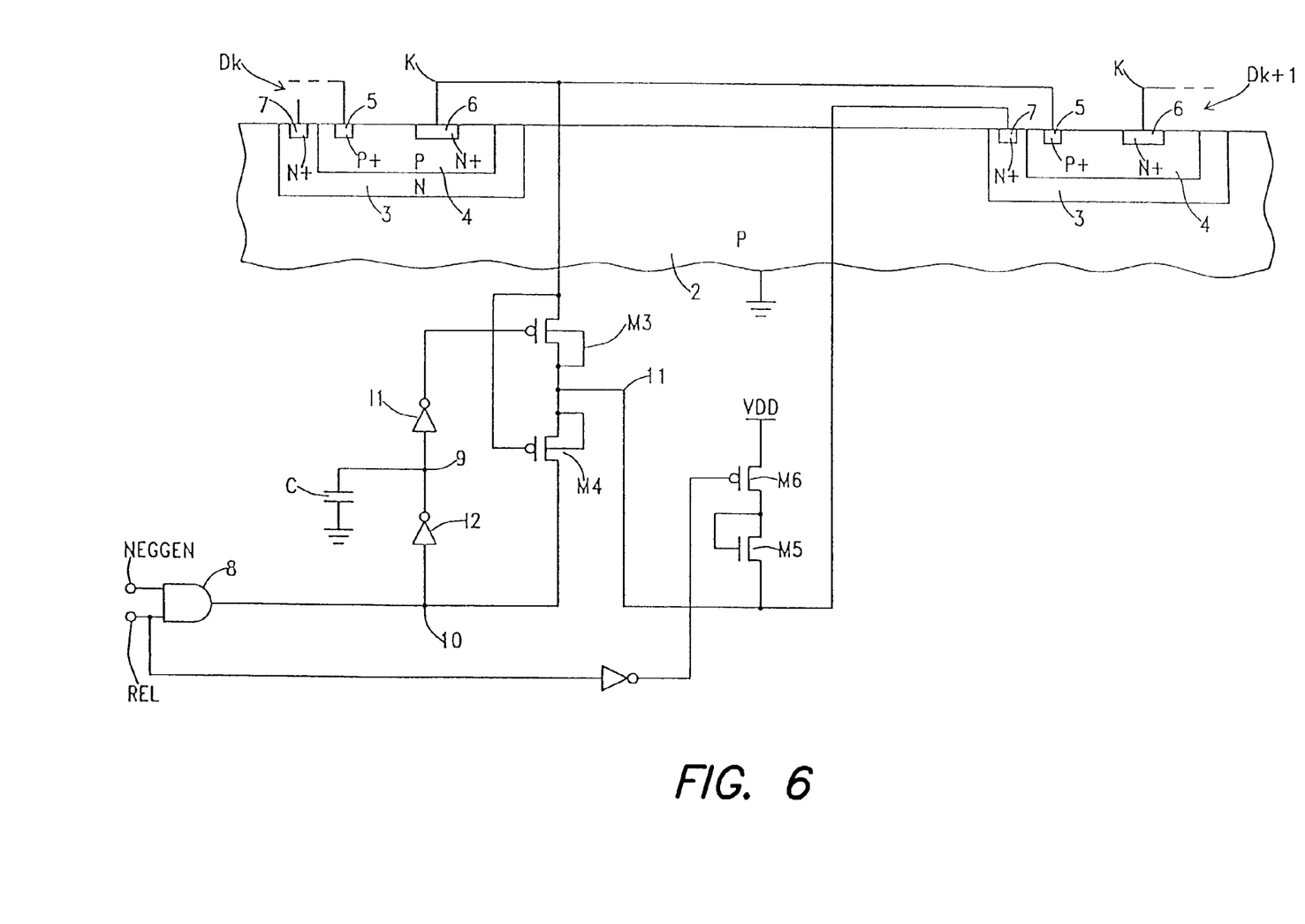
FIG. 6 is a circuit arrangement for achieving the biasing scheme of FIGS. 5A and 5B.

FIG. 6 shows a circuit arrangement suitable for achieving the biasing schemes of FIGS. 5A and 5B. Cathode K of diode Dk is electrically connected to a series of two P-channel MOSFETs M3 and M4. A gate electrode of MOSFET M3 is controlled by an output of an inverter I1 which is in turn supplied by an output of an inverter I2. Inverter I2 is supplied by an output 10 of a two-input AND gate 8 supplied with signals NEGGEN and REL. The output node 9 of inverter I2 is also electrically coupled to ground by means of a capacitor C. Output 10 of AND gate 8 is also connected to a source electrode of MOSFET M4; the gate of MOSFET M4 is connected to the cathode K of diode Dk. An intermediate node 11 between MOSFETs M3 and M4 is connected to the N+ contact region 7 of diode Dk+1. Node 11 is also connected to a drain electrode of an N-channel MOSFET M5 with gate connected to drain; the drain electrode of MOSFET M5 is connected to a drain of a P-channel MOSFET M6 having source connected to VDD; the gate of MOSFET M6 is driven by a logic complement of signal REL.

The operation of the circuit of FIG. 6 will be now explained.

When the charge pump works as a positive charge pump to generate a positive voltage on terminal POS, signal NEGGEN is a logic "0", the output 10 of AND 8 is a logic "0" and MOSFETs M3 and M4 are respectively on and off. The N-type well 3 of diode Dk+1 is thus electrically connected, through M3, to the N+ contact region 6 of diode Dk, and since the latter is connected to the P+ contact region 5 of diode Dk+1, it follows that the N-type well 3 of diode Dk+1 is short-circuited to the P-type well 4 of the same diode, as discussed in connection with FIG. 5A.

When the charge pump works as a negative charge pump to generate a negative voltage on terminal NEG, signal NEGGEN is a logic "1"; however, in this case the logic value of output signal 10 of AND gate 8 depends on the logic value of signal REL. Initially signal REL is a logic "1", signal 10 is a logic "1", MOSFET M3 is off and MOSFET M4 is on. The N-type well 3 of diode Dk+1 is biased at VDD through MOSFET M4 (N+ contact region 7 is connected, through MOSFET M4, to node 10, which in turn is at VDD). Then, after a prescribed time interval, signal REL switches to "0": node 10 switches to "0", but MOSFET M3 cannot turn on because in the meantime the cathode K of diode Dk has achieved a negative potential; for the same reason, MOSFET M4 remains on and biases the N type well 3 of diode Dk+1 to the potential of node 10, i.e. to ground. Switching of signal REL to "0" also causes MOSFET M6 to turn off, so to prevent the creation of a conductive path between VDD and ground through MOSFETs M6, M5, M4 and the pull-down MOSFET of AND gate 8.

Inverters I1 and I2 and capacitor C are necessary to prevent turning on of MOSFET M3 during the switching of signal REL from "1" to "0". Inverters I1 and I2 and capacitor C introduce a delay in the switching of the gate voltage of M3 in consequence of switching of signal REL. Without such a delay, for a finite time interval during switching of signal REL the gate voltage of M3 would be 0V, the source voltage would be VDD and the drain voltage would be negative (because the drain of M3 is connected to the cathode of diode Dk): in these conditions, MOSFET M3 would be on, and a load would be connected to the cathode of diode Dk, thus reducing the efficiency of the charge pump. Thanks to the delay introduced by inverters I1 and I2 and capacitor C, the gate voltage of MOSFET M3 goes to ground when node 11 (i.e., the N-type well 3 of diode Dk+1) is already at ground. MOSFETs M5 and M6 allow to bias the N-type well of the diodes of the charge pump when the latter is not working.

It should be noted that while AND gate 8, inverters I1 and I2, capacitor C, and MOSFET M6 can be unique for all the charge pump stages proximate to the output terminal NEG of the charge pump (for which it is desired that the N-type well 3 of the respective diode is switched from VDD to ground when the anode of the diode attains a rather high negative voltage), distinct MOSFETs M3, M4 and M5 are to be individually provided for each of said charge pump stages. For the remaining stages sufficiently far away from the output terminal NEG, for which it is not necessary to switch the N-type well 3 of the respective diode from VDD to ground, it is only necessary to provide a common resistive load in place of MOSFET M6, and individual MOSFETs M3, M4 and M5 for each stage, wherein MOSFET M3 and the source electrode of MOSFET M4 are directly controlled by signal NEGGEN.

Advantageously, the capacitors C1–Cn of the charge pump can have the structure described in the co-pending European Patent Application No. 96830420.4 filed on Jul. 30, 1996 in the name of the same Applicant, incorporated herein by reference, wherein integrated structure capacitors are described which can be used both for positive and for negative voltages at each of their plates.

Having thus described at least one illustrative embodiment of the present invention, various alterations, modifications and improvements will readily occur to those skilled in the art. Such alterations, modifications and improvements are intended to be within the scope and spirit of the invention. Accordingly, the foregoing description is by way of example only. It is not intended as limiting. The invention's limit is defined only in the claims and the equivalent thereto.

What is claimed is:

1. A charge pump comprising:
   at least one charge pump stage including a first diode having an anode and a cathode, and a capacitor having a first plate connected to the cathode of the first diode and a second plate to receive a clock signal that periodically varies between a reference voltage and a supply voltage having a polarity, the anode of said first diode forming a first terminal of the charge pump;
   a second diode having an anode connected to the cathode of the first diode and a cathode forming a second terminal of the charge pump;
   first switching means for selectively coupling the first terminal of the charge pump to the supply voltage; and
   second switching means for selectively coupling the second terminal of the charge pump to the reference voltage, the first switching means and the second switching means being respectively closed and open in a first operating condition whereby the second terminal of the charge pump acquires a voltage of the same polarity but higher in absolute value than said supply voltage, the first switching means and the second switching means being respectively open and closed in a second operating condition whereby the first terminal of the charge pump acquires a voltage of opposite polarity with respect to said supply voltage.

2. The charge pump of claim 1, wherein said at least one charge pump stage comprises a plurality of substantially identical serially-connected charge pump stages, each having a capacitor with a second terminal to connect to a clock signal, the clock signals applied to adjacent charge pump stages being in phase opposition.

3. The charge pump of claim 2, wherein said first and second diodes are PN junction diodes.

4. The charge pump of claim 3, wherein each of said first and second diodes includes a first well region of a first conductivity type formed in a semiconductor substrate of a second conductivity type, a second well region of the second conductivity type formed inside the first well region forming a first electrode of each of the diodes, and a doped region of the first conductivity type formed inside the second well region forming a second electrode of each of the diodes.

5. The charge pump of claim 4, further comprising first biasing means which in said first operating condition bias the first well region of each one of the diodes at a substantially same voltage as a voltage at the second well region of the one of the diodes.

6. The charge pump of claim 5, further comprising second biasing means which for at least an initial portion of a working time of the charge pump in said second operating condition, bias the first well region of each diode at the supply voltage.

7. The charge pump of claim 6, wherein said second biasing means includes means for switching a bias voltage of the first well region of at least one of the diodes to a ground voltage when a voltage at the first terminal reaches a prescribed value.

8. The charge pump of claim 7, wherein said second switching means includes an N-channel MOSFET having a drain connected to the second terminal of the charge pump and a source connected to a node having a voltage equal to the reference voltage, and said first switching means includes a P-channel MOSFET having a drain connected to the first terminal of the charge pump and a source connected to a switchable supply line which in said second operating condition has a voltage equal to the supply voltage during said initial portion of the working time, and after said initial portion of the working time has a voltage equal to the reference voltage.

9. The charge pump of claim 8, wherein said first conductivity type is an N type conductivity and said second conductivity type is a P type conductivity.

10. A charge pump for coupling to first and second terminals of a voltage supply to receive a supply voltage having a magnitude and a polarity with respect to a reference voltage and for generating a boosted voltage having a magnitude and a polarity, the charge pump comprising:
   a first input to couple to the first terminal of the voltage supply to receive the supply voltage;
   a second input to couple to the second terminal of the voltage supply to receive the reference voltage;
   a charge pump circuit having a first voltage node and a second voltage node, the charge pump circuit being configured to transfer electrical charge from the first node to the second node;
   a first switch that selectively couples the first node of the charge pump circuit to the first input; and
   a second switch that selectively couples the second node of the charge pump circuit to the second input;
   wherein in a first operating condition, the first switch couples the first node to the first input and the second switch substantially isolates the second node from the second input, and in a second operating condition, the second switch couples the second input to the second node and the first switch substantially isolates the first node from the first input; and
   wherein in the first operating mode, the second node of the charge pump circuit acquires a voltage having a polarity equal to the polarity of the supply voltage and having a magnitude greater than the magnitude of the supply voltage, and in the second operating mode, the first node of the charge pump circuit acquires a voltage having a polarity opposite the polarity of the supply voltage and a magnitude greater than the magnitude of the supply voltage.

11. The charge pump of claim 10, wherein the charge pump circuit includes:
   at least one charge pump stage having a first input coupled to the first node, a second input, an output, a first diode coupled between the first input and the output of the charge pump stage, and a capacitor coupled between the output and the second input; and
   a second diode coupled between the output of the at least one charge pump stage and the second node of the charge pump circuit.

12. The charge pump of claim 11, wherein each one of the first and second diodes includes a first well region of a first conductivity type formed in a semiconductor substrate of a second conductivity type, a second well region of the second conductivity type formed inside the first well region forming a first electrode of the one of the diodes, and a doped region of the first conductivity type formed inside the second well region forming a second electrode of the one of the diodes.

13. The charge pump of claim 12, further comprising a first bias circuit coupled to the first well region of the first and second diodes, the first bias circuit in the first operating condition biasing the first well region of each of the first and second diodes at a substantially same voltage as a voltage at the second well of each of the first and second diodes.

14. The charge pump of claim 13, further comprising a second bias circuit coupled to the first well region of each of the first and second diodes, the second bias circuit during an initial working time of the charge pump in the second operating condition biasing the first well region of each of the first and second diodes at the supply voltage.

15. The charge pump of claim 14, wherein the second bias circuit includes a switching circuit that switches a bias voltage of the first well region of the first diode to the reference voltage when a voltage at the first node reaches a predetermined value.

16. The charge pump of claim 15, wherein the charge pump circuit further includes a plurality of charge pump stages coupled between the output of the at least one charge pump stage and the second diode.

17. A charge pump for coupling to first and second terminals of a voltage supply to receive a supply voltage having a magnitude and a polarity with respect to a reference voltage and for generating a boosted voltage having a magnitude and a polarity, the charge pump comprising:
   a first input to couple to the first terminal of the voltage supply to receive the supply voltage;
   a second input to couple to the second terminal of the voltage supply to receive the reference voltage;
   a charge pump circuit having a first voltage node and a second voltage node, the charge pump circuit being configured to transfer electrical charge from the first node to the second node;
   a first switch that selectively couples the first node of the charge pump circuit to the first input;
   a second switch that selectively couples the second node of the charge pump circuit to the second input;
   at least one charge pump stage having a first input coupled to the first node, a second input, an output, a first diode coupled between the first input and the output of the charge pump stage, and a capacitor coupled between the output and the second input; and
   a second diode coupled between the output of the at least one charge pump stage and the second node of the charge pump circuit.

18. The charge pump of claim 17, wherein each one of the first and second diodes includes a first well region of a first conductivity type formed in a semiconductor substrate of a second conductivity type, a second well region of the second conductivity type formed inside the first well region forming a first electrode of the one of the diodes, and a doped region of the first conductivity type formed inside the second well region forming a second electrode of the one of the diodes.

19. The charge pump of claim 17, wherein the charge pump circuit further includes a plurality of charge pump stages coupled between the output of the at least one charge pump stage and the second diode.

20. A charge pump for coupling to a voltage supply to receive a supply voltage having a magnitude and a polarity with respect to a reference voltage and for generating a boosted voltage having a magnitude and a polarity, the charge pump comprising:
   a charge pump circuit having a first voltage node and a second voltage node, the charge pump circuit being configured to transfer electrical charge from the first node to the second node;
   means for coupling the charge pump circuit to the reference voltage for a first mode of operation of the charge pump for producing a voltage at the first node having a polarity opposite the polarity of the supply voltage and having a magnitude greater than the magnitude of the supply voltage; and
   means for coupling the charge pump circuit to the voltage supply for a second mode of operation of the charge pump circuit for producing a voltage at the second node having a polarity equal to the polarity of the supply voltage and having a magnitude greater than the magnitude of the supply voltage.

21. The charge pump of claim 20, wherein the charge pump circuit includes:
   at least one charge pump stage having a first input coupled to the first node, a second input, an output, a first diode coupled between the first input and the output of the charge pump stage, and a capacitor coupled between the output and the second input; and
   a second diode coupled between the output of the at least one charge pump stage and the second node of the charge pump circuit.

22. The charge pump of claim 21, wherein each one of the first and second diodes includes a first well region of a first conductivity type formed in a semiconductor substrate of a second conductivity type, a second well region of the second conductivity type formed inside the first well region forming a first electrode of the one of the diodes, and a doped region of the first conductivity type formed inside the second well region forming a second electrode of the one of the diodes.

23. The charge pump of claim 22, further comprising means for biasing the first well region of each of the first and second diodes at a substantially same voltage as a voltage at the second well of each of the first and second diodes during the second mode of operation.

24. The charge pump of claim 23, further comprising means for biasing the first well region of each of the first and second diodes at the supply voltage during an initial working time of the charge pump in the first mode of operation.

25. The charge pump of claim 24, further comprising means for switching a bias voltage of the first well region of the first diode to the reference voltage when a voltage at the first node reaches a predetermined value.

26. The charge pump of claim 25, wherein the charge pump circuit further includes a plurality of charge pump stages coupled between the output of the at least one charge pump stage and the second diode.

27. The charge pump of claim 21, wherein the charge pump circuit further includes a plurality of charge pump stages coupled between the output of the at least one charge pump stage and the second diode.

28. A method of generating a boosted voltage having a magnitude and a polarity with respect to a reference voltage using a supply voltage having a magnitude and a polarity with respect to the reference voltage, the method comprising steps of:
   providing a charge pump circuit having a first voltage node and a second voltage node, the charge pump circuit being configured to transfer electrical charge from the first node to the second node;
   applying the supply voltage to the first node of the charge pump circuit to produce a boosted voltage at the second node, the boosted voltage having a polarity equal to the polarity of the supply voltage and having a magnitude greater than the magnitude of the supply voltage; and
   applying the reference voltage to the second node of the charge pump circuit to produce a boosted voltage at the first node, the boosted voltage having a polarity opposite the polarity of the supply voltage and having a magnitude greater than the magnitude of the supply voltage.

29. The method of claim 28, wherein the charge pump circuit includes first and second diodes each having a first well region of a first conductivity type formed in a semiconductor substrate of a second conductivity type, a second well region of the second conductivity type formed inside the first well region forming a first electrode of each of the diodes, and a doped region of the first conductivity type formed inside the second well region forming a second electrode of each of the diodes, and wherein the method further comprises a step of biasing the first well region of each of the first and second diodes at a substantially same voltage as a voltage at the second well of each of the first and second diodes when the supply voltage is applied to the first node.

30. The method of claim 29, further comprising a step of biasing the first well region of each of the first and second diodes at the supply voltage when the reference voltage is applied to the second node of the charge pump circuit.

31. The method of claim 30, further comprising a step of switching a bias voltage of the first well region of the first diode to the reference voltage when a voltage at the first node reaches a predetermined value.

32. The method of claim 28, wherein the charge pump circuit includes first and second diodes each having a first well region of a first conductivity type formed in a semiconductor substrate of a second conductivity type, a second well region of the second conductivity type formed inside the first well region forming a first electrode of each of the diodes, and a doped region of the first conductivity type formed inside the second well region forming a second electrode of each of the diodes, and wherein the method further comprises a step of biasing the first well region of each of the first and second diodes at the supply voltage when the reference voltage is applied to the second node of the charge pump circuit.

33. The method of claim 32, further comprising a step of switching a bias voltage of the first well region of the first diode to the reference voltage when a voltage at the first node reaches a predetermined value.

34. A memory device comprising:
   a first input to receive a supply voltage having a magnitude and a polarity with respect to a reference voltage;
   a second input to receive the reference voltage;
   a charge pump coupled to the first and second inputs to respectively receive the supply voltage and the reference voltage, the charge pump including:

a charge pump circuit having a first voltage node and a second voltage node, the charge pump circuit being configured to transfer electrical charge from the first node to the second node;

a first switch that selectively couples the first node of the charge pump circuit to the first input of the memory device; and a second switch that selectively couples the second node of the charge pump circuit to the second input of the memory device; and a first clock input to receive a first clock signal; and a clock generator coupled to the first clock input of the charge pump circuit to provide the first clock signal;

wherein in a first operational mode of the memory device, the first switch couples the first node to the first input and the second switch substantially isolates the second node from the second input, and in a second operational mode of the memory device, the second switch couples the second input to the second node and the first switch substantially isolates the first node from the first input; and wherein in the first operational mode, the second node of the charge pump circuit acquires a voltage having a polarity equal to the polarity of the supply voltage and having a magnitude greater than the magnitude of the supply voltage, and in the second operational mode, the first node of the charge pump circuit acquires a voltage having a polarity opposite the polarity of the supply voltage and a magnitude greater than the magnitude of the supply voltage.

35. The memory device of claim 34, wherein the charge pump circuit further includes:

at least one charge pump stage having a first input coupled to the first node, a second input coupled to the first clock input, an output, a first diode coupled between the first input of the charge pump stage and the output, and a capacitor coupled between the output and the second input of the charge pump stage; and a second diode coupled between the output of the at least one charge pump stage and the second node of the charge pump circuit.

36. The memory device of claim 35, wherein each one of the first and second diodes includes a first well region of a first conductivity type formed in a semiconductor substrate of a second conductivity type, a second well region of the second conductivity type formed inside the first well region forming a first electrode of the one of the diodes, and a doped region of the first conductivity type formed inside the second well region forming a second electrode of the one of the diodes.

37. The memory device of claim 36, further comprising a first bias circuit coupled to the first well region of the first and second diodes, the first bias circuit in the first operational mode biasing the first well region of each of the first and second diodes at a substantially same voltage as a voltage at the second well of each of the first and second diodes.

38. The memory device of claim 37, further comprising a second bias circuit coupled to the first well region of each of the first and second diodes, the second bias circuit during an initial working time of the charge pump in the second operational mode biasing the first well region of each of the first and second diodes at the supply voltage.

39. The memory device of claim 38, wherein the second bias circuit includes a switching circuit that switches a bias voltage of the first well region of the first diode to the reference voltage when a voltage at the first node reaches a predetermined value.

40. The memory device of claim 39, wherein the charge pump further includes a second clock input and a plurality of charge pump stages coupled between the output of the at least one charge pump stage and the second diode, each of the charge pump stages being coupled to one of the first and second clock inputs, and wherein the clock generator has a second output coupled to the second clock input of the charge pump circuit to provide a second clock signal, the first and second clock signals being substantially in phase opposition with each other.

41. A memory device comprising:

a first input to receive a supply voltage having a magnitude and a polarity with respect to a reference voltage;

a second input to receive the reference voltage;

a charge pump coupled to the first and second inputs to respectively receive the supply voltage and the reference voltage, the charge pump including:

a charge pump circuit having a first voltage node and a second voltage node, the charge pump circuit being configured to transfer electrical charge from the first node to the second node;

a first switch that selectively couples the first node of the charge pump circuit to the first input of the memory device;

a second switch that selectively couples the second node of the charge pump circuit to the second input of the memory device;

a first clock input to receive a first clock signal;

a clock generator coupled to the first clock input of the charge pump circuit to provide the first clock signal;

at least one charge pump stage having a first input coupled to the first node, a second input, an output, a first diode coupled between the first input of the charge pump stage and the output, and a capacitor coupled between the output and the second input of the charge pump stage; and a second diode coupled between the output of the at least one charge pump stage and the second node of the charge pump circuit.

42. The memory device of claim 41, wherein each one of the first and second diodes includes a first well region of a first conductivity type formed in a semiconductor substrate of a second conductivity type, a second well region of the second conductivity type formed inside the first well region forming a first electrode of the one of the diodes, and a doped region of the first conductivity type formed inside the second well region forming a second electrode of the one of the diodes.

43. The memory device of claim 42, further comprising a first bias circuit coupled to the first well region of the first and second diodes, the first bias circuit in the first operational mode biasing the first well region of each of the first and second diodes at a substantially same voltage as a voltage at the second well of each of the first and second diodes.

44. The memory device of claim 43, further comprising a second bias circuit coupled to the first well region of each of the first and second diodes, the second bias circuit during an initial working time of the charge pump in the second operational mode biasing the first well region of each of the first and second diodes at the supply voltage.

45. The memory device of claim 44, wherein the second bias circuit includes a switching circuit that switches a bias voltage of the first well region of the first diode to the reference voltage when a voltage at the first node reaches a predetermined value.

* * * * *